US009978992B2

(12) United States Patent
Peng

(10) Patent No.: US 9,978,992 B2
(45) Date of Patent: May 22, 2018

(54) SCATTERING LAYER AND METHOD FOR PREPARING THE SAME, AND ORGANIC LIGHT-EMITTING DIODE DISPLAY DEVICE COMPRISING THE SAME

(71) Applicant: BOE TECHNOLOGY GROUP CO., LTD., Beijing (CN)

(72) Inventor: Rui Peng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 15/091,013

(22) Filed: Apr. 5, 2016

(65) Prior Publication Data
US 2017/0047551 A1 Feb. 16, 2017

(30) Foreign Application Priority Data

Aug. 12, 2015 (CN) .......................... 2015 1 0494601

(51) Int. Cl.
*B05D 5/12* (2006.01)
*H01L 51/52* (2006.01)
*H01L 51/00* (2006.01)

(52) U.S. Cl.
CPC ...... *H01L 51/5268* (2013.01); *H01L 51/0003* (2013.01); *H01L 51/004* (2013.01); *H01L 51/0035* (2013.01); *H01L 51/0043* (2013.01)

(58) Field of Classification Search
CPC combination set(s) only.
See application file for complete search history.

(56) References Cited

U.S. PATENT DOCUMENTS

| 4,859,737 | A | * | 8/1989 | Modic | C08L 67/02 525/176 |
| 2002/0039657 | A1 | * | 4/2002 | Brunelle | B32B 27/06 428/423.7 |
| 2008/0315270 | A1 | * | 12/2008 | Marsh | B32B 25/00 257/292 |
| 2009/0239086 | A1 | | 9/2009 | Ishizuka | |
| 2010/0055390 | A1 | * | 3/2010 | Ishizuka | B32B 15/08 428/119 |

(Continued)

FOREIGN PATENT DOCUMENTS

CN 1645977 A 7/2005
CN 102621607 A 8/2012

(Continued)

OTHER PUBLICATIONS

Chinese Office Action dated Oct. 24, 2016.

(Continued)

*Primary Examiner* — Austin Murata
(74) *Attorney, Agent, or Firm* — Dilworth & Barrese, LLP; Michael J. Musella, Esq.

(57) ABSTRACT

Provided are a scattering layer and a method for preparing the same, and an organic light-emitting diode display device prepared thereby. The scattering layer is formed by coating a block copolymer solution of a polybutadiene-polystyrene onto a substrate to form a film, and then subjecting the film to treatment of curing and annealing. The resulting scattering layer includes a nanoscale polystyrene microsphere structure obtained by self-assembling polystyrene and polybutadiene.

8 Claims, 3 Drawing Sheets

(56) References Cited

U.S. PATENT DOCUMENTS

2010/0103414 A1* 4/2010 Okamoto ................ C08J 3/02
356/326
2016/0172630 A1* 6/2016 Reusch ............... H01L 51/5268
257/40

FOREIGN PATENT DOCUMENTS

| CN | 103503570 A | 1/2014 |
|---|---|---|
| CN | 104685970 A | 6/2015 |

OTHER PUBLICATIONS

Jia Ruokun, Li Tingting, Zhou Shiyu, Shrinking and Light Defraction of the Self-Organized Polystyrene-block-Polybutadiene Microporous Film Deposited on a Stretched Polymer Film by Thermal Contraction,College of Chemical Engineering, Northeast Dianli University, Jilin, 132012, China, Accepted Dec. 10, 2013.
Samson A, Jenekhe and X. Linda Chen, Self-Assembled Aggregates of Rod-Coil Block Copolymers and Their Solubilization and Encapsulation of Fullernes, www.sciencemag.org, vol. 279, Mar. 20, 1998.
Second Chinese Office Action dated Apr. 1, 2017.
Third Chinese Office Action dated Jun. 13, 2017.

* cited by examiner

SCATTERING LAYER AND METHOD FOR PREPARING THE SAME, AND ORGANIC LIGHT-EMITTING DIODE DISPLAY DEVICE COMPRISING THE SAME

TECHNICAL FIELD

The present disclosure relates to a scattering layer and a method for preparing the same, and an organic light-emitting diode display device comprising the same.

BACKGROUND

The light-exiting rate of an organic light-emitting diode (OLED) device is enhanced mainly by technical means of reducing modality of surface plasma, reducing modality of a waveguide, reducing modality of a substrate, and increasing external modality. Reducing modality of a substrate mainly includes three modes: 1. forming a rough layer at the interface between glass and air; 2. coating microspheres at a light-exiting surface; and 3. coating a scattering layer at a light-exiting surface. The method of coating a scattering layer at a light-exiting surface is to coat resins doped with inorganic particles onto the light-exiting surface of OLED so as to improve the light-exiting rate of OLED, where the inorganic particles used are small particles such as doped silica particles, ZrO, etc. However, during the actual use process, it is found that the light-exiting rate of organic light-emitting diode (OLED) is still low.

SUMMARY

An embodiment of the present disclosure provides a method for preparing a scattering layer, comprising coating (for example knife-coating) a solution of a polybutadiene-polystyrene block polymer onto a surface of a substrate to form a film, and then subjecting the film to treatment of curing and annealing. In some embodiments, the substrate is a substrate for providing an organic light-emitting diode, the surface of which is a light-exiting surface.

Another embodiment of the present disclosure further provides a scattering layer prepared by the above method, wherein the scattering layer has a thickness of 100 to 200 microns.

Further another embodiment of the present disclosure further provides an organic light-emitting diode (OLED) display device comprising the above scattering layer, which has a greater light-exiting rate and can find applications in fields such as display panels, mobile phones, digital cameras, DVD players, personal digital assistants (PDA), laptops, car stereos and televisions.

BRIEF DESCRIPTION OF THE DRAWINGS

In order to illustrate the technical solutions of the embodiments of the present disclosure more clearly, the drawings of the embodiments are simply described below. Apparently, the drawings described below relate to only some embodiments of the present disclosure and are not limitative of the present disclosure.

Figure 1:
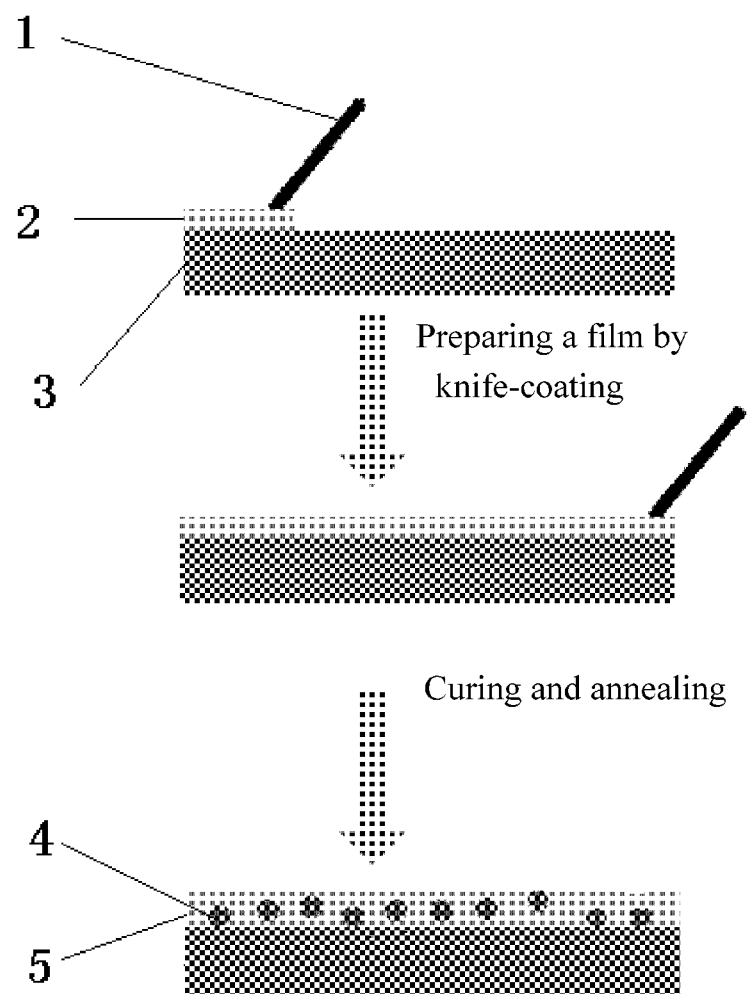
FIG. 1 is a flow chart of making the scattering layer according to the present disclosure.

Reference signs: 1. a scraper; 2. a solution of a polybutadiene-polystyrene block polymer; 3. a substrate; 4. a microsphere structure obtained by self-assembling a block polymer comprising a polystyrene segment and a polybutadiene segment; 5. a scattering layer; 6. an anode; 7. an organic light-emitting layer; 8. a cathode.

DETAILED DESCRIPTION

To make clearer the objects, technical solutions and advantages of the embodiments of the present disclosure, a clear and full description of the technical solutions of the embodiments of the present disclosure will be made with reference to the accompanying drawings of the embodiments of the present disclosure. Obviously, the embodiments described are merely part of rather than all of the embodiments of the present disclosure. Based on the embodiments of the present disclosure described, all the other embodiments acquired by a person of ordinary skill in the art, without any creative labor, fall within the scope of protection of the present disclosure.

In the present application, the term "a solution of a polybutadiene-polystyrene block polymer" refers to a block polymer comprising a polystyrene block and a polybutadiene block.

An embodiment of the present disclosure provides a scattering layer and a method for preparing the same, and an organic light-emitting diode (OLED) display device comprising the same, where the light-exiting rate of OLED is improved by means of the self-assembling characteristics of the scattering layer.

An embodiment of the present disclosure provides a method for preparing a scattering layer, comprising coating (for example knife-coating) a solution of a polybutadiene-polystyrene block polymer onto the surface of a substrate to form a film, and then subjecting the film to treatment of curing and annealing. The resulting scattering layer comprises a nanoscale polystyrene microsphere structure obtained by self-assembling polystyrene and polybutadiene, so as to reduce total reflection at the interface between air and a glass substrate, increase export of light, and improve the light-exiting rate of OLED. In some embodiments, the substrate is a substrate for providing an organic light-emitting diode, the surface of which is a light-exiting surface.

In the method for preparing a scattering layer as described in the embodiment of the present disclosure, the solution of the polybutadiene-polystyrene block polymer is a solution with a weight concentration of 0.4 wt % to 2 wt % formulated by dissolving the polybutadiene-polystyrene block polymer in an organic solvent. In some embodiments, the polybutadiene-polystyrene block polymer has a weight concentration of 0.6 wt % in the solution. By adjusting the concentration of the block polymer in a solvent, it will help to obtain a film with a uniform thickness, so as to obtain a nanoscale polystyrene microsphere structure obtained by self-assembling polystyrene and polybutadiene.

In the method for preparing a scattering layer as described in the embodiment of the present disclosure, the polybutadiene-polystyrene block polymer is a diblock or triblock polymer obtained by segment alternating polymerization of polybutadiene and polystyrene, having a molecular weight of between 50,000 and 200,000 daltons, wherein the weight content of polystyrene is 1 wt % to 9 wt %. The polybutadiene-polystyrene block polymer is obtainable by conventional polymerization methods in the art or is commercially available.

In the method for preparing a scattering layer as described in the embodiment of the present disclosure, the polybutadiene-polystyrene diblock polymer is a linear copolymer formed by segment alternating polymerization of a homopolymer using butadiene as a monomer and a homopolymer using styrene as a monomer; the polybutadiene-polystyrene triblock polymer is a polystyrene-polybutadiene-polystyrene linear copolymer formed by segment alternating polymerization of a homopolymer using styrene as a monomer and a homopolymer using butadiene as a monomer. Through experimental verification, the polybutadiene-polystyrene block polymers having the above specific components and molecular weights exhibit better self-assembling performance in a solution, which is more favorable for micro-phase separation.

In the method for preparing a scattering layer as described in the embodiment of the present disclosure, the organic solvent is formed by mixing a good solvent and a poor solvent of a block polymer, wherein the volatilization rate of the good solvent is greater than the volatilization rate of the poor solvent.

In the method for preparing a scattering layer as described in the embodiment of the present disclosure, the good solvent is selected from the group consisting of dichloromethane and trichloromethane; the poor solvent is selected from the group consisting of trifluoroacetic acid and n-hexane. As some embodiments of the present disclosure, the organic solvent is formed by blending dichloromethane and trifluoroacetic acid or by blending trichloromethane and n-hexane.

In the method for preparing a scattering layer as described in the embodiment of the present disclosure, the good solvent and the poor solvent ratio are mixed at a volume ratio of (1-3):1, for example, 3:1.

As some embodiments of the present disclosure, the solution of the polybutadiene-polystyrene block polymer is obtained by dissolving the polybutadiene-polystyrene diblock polymer at a weight concentration of 0.6 wt % in a solvent obtained by blending dichloromethane and trifluoroacetic acid in a volume ratio of 3:1. The polymer solution formulated by adjusting appropriate ratios can be coated more uniformly onto the light-exiting surface of a substrate on which an organic light-emitting diode is formed, achieve better self-assembling effects, and therefore can result in more desirable nanoscale microspheres.

In the method for preparing a scattering layer as described in the embodiment of the present disclosure, the treatment of curing and annealing is carried out at a temperature of 65° C.-100° C., for example, 80° C. By reasonably controlling the temperature for curing and annealing, it can be ensured that the polystyrene and polybutadiene within the film are self-assembled to result in a nanoscale polystyrene microsphere structure, so as to reduce total reflection at the interface between air and a glass substrate, increase export of light, and improve the light-exiting rate of OLED.

An embodiment of the present disclosure further provides a scattering layer prepared by the above method, wherein the scattering layer has a thickness of 100 to 200 microns.

Another embodiment of the present disclosure further provides an organic light-emitting diode (OLED) display device comprising the above scattering layer, which has a greater light-exiting rate and can find applications in fields such as display panels, mobile phones, digital cameras, DVD players, personal digital assistants (PDA), laptops, car stereos and televisions.

By using the technical solution as described in the embodiment of the present disclosure, a polymer film is formed on the light-exiting surface of OLED as a scattering layer, which is then subjected to curing and annealing to form a nanoscale polystyrene-polybutadiene self-assembled microsphere structure within the film, which can reduce total reflection at the interface between air and a glass substrate, increase export of light, and improve the light-exiting rate of OLED. The method is simple and easy to operate, and is suitable for mass production.

Embodiment 1 Method for Preparing a Scattering Layer

A method for preparing a scattering layer according to the present embodiment, as shown in FIG. 1, the polybutadine-polystyrene diblock polymer is dissolved at a weight concentration of 0.6 wt % in a solvent obtained by blending dichloromethane and trifluoroacetic acid in a volume ratio of 3:1 to be stirred uniformly, resulting in a solution 2 of the polybutadine-polystyrene diblock polymer, and then a scraper 1 is used to knife-coat the polymer solution 2 onto the light-exiting surface of the substrate provided with OLED (i.e., substrate 3) to form a film, and finally treatment of curing and annealing is carried out to obtain a scattering layer 5 having a nanoscale polystyrene microsphere structure 4 obtained by self-assembling polystyrene and polybutadiene, having a thickness of 150 microns.

In Embodiment 1, curing and annealing are carried out at a temperature of 65° C.

In Embodiment 1, the polybutadiene-polystyrene diblock polymer has a molecular weight of 50,000 to 200,000 daltons and a refractive index of 1.5 to 1.6, where the amount of polystyrene is 1 wt % to 9 wt %.

Figure 3:
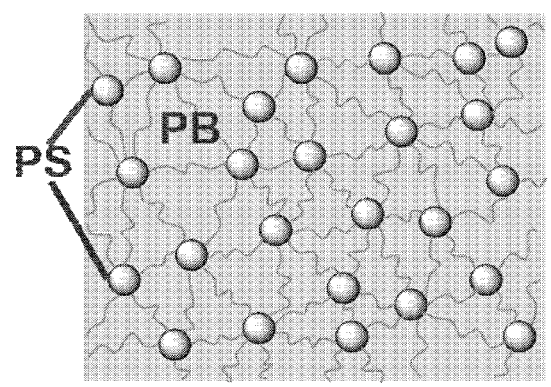
FIG. 3 is a schematic view of the polystyrene microsphere structure within the scattering layer according to the present disclosure.

FIG. 3 is a schematic view of the polystyrene microsphere structure within the scattering layer. The polystyrene microsphere is obtained by micro-phase separation, where the preconditions for obtaining micro-phase separation are as described in Embodiment 1. Without being bounded by theory, it is believed that the principle for forming the microsphere structure is as follows: in the polystyrene block-polybutadiene block-polystyrene block or polystyrene block-polybutadiene block, the polystyrene block belongs to a hard segment and the polybutadiene block belongs to a soft segment, where upon micro-phase separation, the polystyrene blocks gather together to form a microsphere. The structure formed is like the web as shown in FIG. 3, where the junction of the web rope is a small ball, i.e., the web rope is a polybutadiene block and the small ball is the microsphere structure formed by the polystyrene block.

Embodiment 2 Method for Preparing a Scattering Layer

The method for preparing a scattering layer according to the present embodiment is the same as that in Embodiment 1 except that: curing and annealing are carried out at a temperature of 80° C.

Embodiment 3 Method for Preparing a Scattering Layer

The method for preparing a scattering layer according to the present embodiment is the same as that in Embodiment 1 except that: curing and annealing are carried out at a temperature of 100° C.

Embodiment 4 Method for Preparing a Scattering Layer

The method for preparing a scattering layer according to the present embodiment is the same as that in Embodiment 1 except that:

1) the solution of the polybutadiene-polystyrene diblock polymer is obtained by dissolving the polybutadiene-polystyrene diblock polymer at a weight concentration of 0.4 wt % in a solvent obtained by blending dichloromethane and trifluoroacetic acid in a volume ratio of 3:1.

The scattering layer has a thickness of 100 microns, and comprises a nanoscale microsphere structure, which can reduce total reflection at the interface between air and a glass substrate, increase export of light, and improve the light-exiting rate of OLED.

Embodiment 5 Method for Preparing a Scattering Layer

The method for preparing a scattering layer according to the present embodiment is the same as that in Embodiment 1 except that:

1) the solution of the polybutadiene-polystyrene block polymer is obtained by dissolving the polybutadiene-polystyrene diblock polymer at a weight concentration of 2 wt % in a solvent obtained by blending dichloromethane and trifluoroacetic acid in a volume ratio of 3:1.

The scattering layer has a thickness of 200 microns.

Embodiment 6 Method for Preparing a Scattering Layer

The method for preparing a scattering layer according to the present embodiment is the same as that in Embodiment 1 except that:

1) the solution of the polybutadiene-polystyrene block polymer is obtained by dissolving the polystyrene-polybutadiene-polystyrene triblock polymer at a weight concentration of 0.4 wt % in a solvent obtained by blending dichloromethane and trifluoroacetic acid in a volume ratio of 3:1.

The scattering layer has a thickness of 200 microns.

Embodiment 7 Method for Preparing a Scattering Layer

The method for preparing a scattering layer according to the present embodiment is the same as that in Embodiment 1 except that:

1) the solution of the polybutadiene-polystyrene block polymer is obtained by dissolving the polystyrene-polybutadiene-polystyrene triblock polymer at a weight concentration of 0.6 wt % in a solvent obtained by blending dichloromethane and trifluoroacetic acid in a volume ratio of 1:1.

Embodiment 8 Method for Preparing a Scattering Layer

The method for preparing a scattering layer according to the present embodiment is the same as that in Embodiment 1 except that:

1) the solution of the polybutadiene-polystyrene block polymer is obtained by dissolving the polystyrene-polybutadiene-polystyrene triblock polymer at a weight concentration of 0.6 wt % in a solvent obtained by blending dichloromethane and n-hexane in a volume ratio of 3:1.

Embodiment 9 OLED Display Device

The OLED display device according to the present embodiment comprises the above scattering layer prepared according to Embodiment 1.

Figure 2:
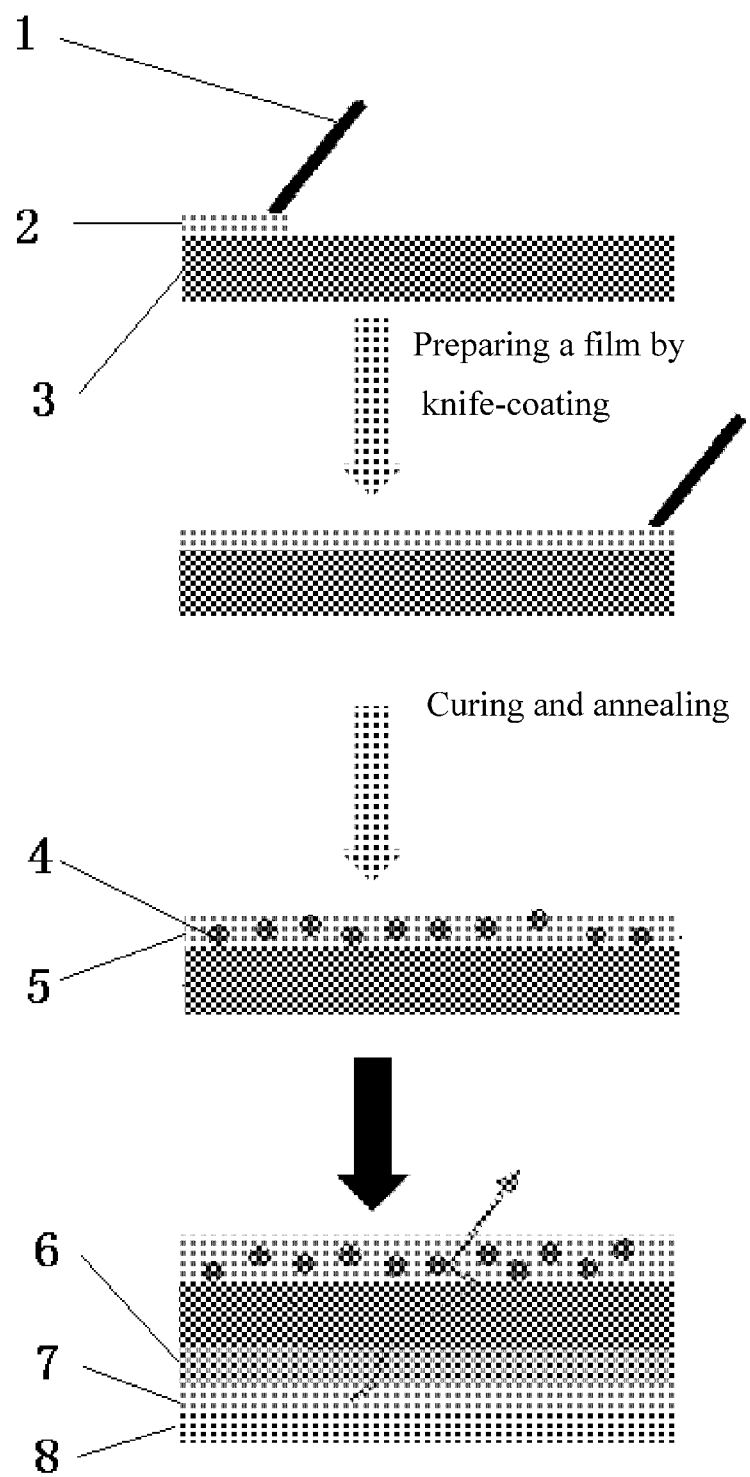
FIG. 2 is a flow chart of making the OLED display device according to the present disclosure.

The OLED display device is as shown in FIG. 2, wherein the substrate 3 on which a scattering layer 5 is formed is provided with an anode 6, an organic light-emitting layer 7 and a cathode 8 by a conventional method to obtain an OLED device, wherein the order in which the scattering layer 5, the anode 6, the organic light-emitting layer 7 and the cathode 8 are formed can be adjusted in light of the design requirement, for example, a scattering layer 5 can be first formed on a substrate 3, and then an anode 6, an organic light-emitting layer 7 and a cathode 8 are formed thereafter; alternatively, an anode 6, an organic light-emitting layer 7 and a cathode 8 can be first formed, and then a scattering layer 5 is formed.

Embodiment 10 OLED Display Device

The OLED display device according to the present embodiment comprises the above scattering layer prepared according to Embodiment 2.

Embodiment 11 OLED Display Device

The OLED display device according to the present embodiment comprises the above scattering layer prepared according to Embodiment 3.

Table 1 below shows the light-exiting rates of the OLED display device in Embodiments 9-11 and the OLED display device comprising no scattering layer. As can be seen from Table 1, the light-exiting rate of the OLED display device described in Embodiments 9-11 is significantly improved than the OLED display device comprising no scattering layer.

TABLE 1

| No. | Weight percentage | Solvent | Solvent ratio | Annealing temperature | Light-exiting rate |
|---|---|---|---|---|---|
| Embodiment 9 | 0.6 wt % | Dichloromethane; trifluoroacetic acid | 3:1 | 65° C. | 35% |
| Embodiment 10 | | | | 80° C. | 38% |
| Embodiment 11 | | | | 100° C. | 36% |
| OLED display device comprising no scattering layer | / | / | / | / | 20%-30% |

The above are merely exemplary embodiments of the present disclosure, and are not intended to limit the scope of protection of the present disclosure, which is yet determined by the appended claims.

The present application claims the priority of the Chinese patent application No. 201510494601.7 submitted on Aug. 12, 2015, and the content disclosed in the above Chinese patent application is incorporated herein by reference as part of the present application.

What is claimed is:

1. A method for preparing a scattering layer, comprising coating a solution of a polybutadiene-polystyrene block polymer onto a surface of a substrate to form a film, and then subjecting the film to treatment of curing and annealing;
    wherein the solution of the polybutadiene-polystyrene block polymer comprises an organic solvent;
    the organic solvent is formed by mixing a first solvent and a second solvent of a polybutadiene-polystyrene block polymer;
    the first solvent is dichloromethane; and
    the second solvent is trifluoroacetic acid,
    wherein the polybutadiene-polystyrene block polymer is a polybutadiene-polystyrene diblock or triblock polymer obtained by segment alternating polymerization of polybutadiene and polystyrene, having a molecular weight of between 50,000 and 200,000 daltons.

2. The method according to claim 1, wherein the solution of the polybutadiene-polystyrene block polymer is a solution with a weight concentration of 0.4 wt % to 2 wt % formulated by dissolving the polybutadiene-polystyrene block polymer in the organic solvent.

3. The method according to claim 2, wherein the weight content of polystyrene is 1 wt % to 9 wt % of the block polymer.

4. The method according to claim 3, wherein the polybutadiene-polystyrene diblock polymer is a linear copolymer formed by segment alternating polymerization of a homopolymer using butadiene as a monomer and a homopolymer using styrene as a monomer; and the polybutadiene-polystyrene triblock polymer is a polystyrene-polybutadiene-polystyrene linear copolymer formed by segment alternating polymerization of a homopolymer using styrene as a monomer and a homopolymer using butadiene as a monomer.

5. The method according to claim 1, wherein the volume ratio of the first solvent to the second solvent ratio 1:1 to 3:1.

6. The method according to claim 1, wherein the treatment of curing and annealing is carried out at a temperature of 65-100° C.

7. The method according to claim 6, wherein the treatment of curing and annealing is carried out at a temperature of 80° C.

8. The method according to claim 1, wherein the substrate is a substrate for providing an organic light-emitting diode, the surface of which is a light-exiting surface.

\* \* \* \* \*